(12) United States Patent
Hsieh

(10) Patent No.: US 6,377,120 B1
(45) Date of Patent: Apr. 23, 2002

(54) REGULATED-CASCODE AMPLIFIER WITH CLAMPING CIRCUIT

(75) Inventor: Chih-Cheng Hsieh, Hsinchu (TW)

(73) Assignee: Pixart Imaging Inc., Hsinchu (TW)

( * ) Notice: Subject to any disclaimer, the term of this patent is extended or adjusted under 35 U.S.C. 154(b) by 0 days.

(21) Appl. No.: 09/655,005

(22) Filed: Sep. 5, 2000

(30) Foreign Application Priority Data

Jul. 18, 2000 (TW) ........................................ 89114317 A

(51) Int. Cl.$^7$ ................................................ H03F 3/45
(52) U.S. Cl. ...................... 330/253; 330/261; 327/314; 327/319; 327/320; 327/321
(58) Field of Search ................ 330/253, 261; 327/314, 319, 320, 321, 315

(56) References Cited

U.S. PATENT DOCUMENTS 4,818,893 A * 4/1989 Domnitz ...................... 327/314

* cited by examiner

Primary Examiner—Michael B Shingleton
(74) Attorney, Agent, or Firm—J.C. Patents

(57) ABSTRACT

A regulated-cascode amplifier circuit comprising a positive sub-line, a negative sub-line, a first auxiliary amplifier, a second auxiliary amplifier and a clamping circuit. The positive sub-line has a positive output terminal and the negative sub-line has a negative output terminal. The positive and negative sub-line each has a cascode transistor structure. Each auxiliary amplifier includes a positive input terminal, a negative input terminal, a positive-bias output terminal and a negative-bias output terminal. The clamping circuit includes a first diode and a second diode. The front terminal of the first diode is electrically connected to the end terminal of the second diode. The front terminal of the second diode is electrically connected to the end terminal of the first diode. In addition, each auxiliary diode is connected to a clamping circuit such that the positive-bias output terminal and the negative-bias output terminal are connected to the two terminals of the diode clamping circuit respectively.

6 Claims, 3 Drawing Sheets

REGULATED-CASCODE AMPLIFIER WITH CLAMPING CIRCUIT

CROSS-REFERENCE TO RELATED APPLICATION

This application claims the priority benefit of Taiwan application serial no. 89114317, filed Jul. 18, 2000.

BACKGROUND OF THE INVENTION

1. Field of Invention

The present invention relates to a regulated-cascode amplifier circuit. More particularly, the present invention relates to a regulated-cascode amplifier with a clamping circuit.

2. Description of Related Art

In conventional technique, the gain of an amplifier is increased by increasing the resistance of output load. One method of increasing load resistance of an amplifier is to use cascode transistors to serve as an output load. A cascode transistor load is formed by connecting a common source metal-oxide-semiconductor (MOS) transistor and a common gate MOS transistor serially. Another method of increasing load resistance of an amplifier is to use an auxiliary amplifier to generate an even higher load in addition to a cascode transistor load. This type of special circuit architecture is referred to as a regulated-cascode load.

However, when output signal from an amplifier having the regulated-cascode load is amplified to the largest possible value, the amplifier and the auxiliary amplifier may have to operate in their respective non-linear operating region. Once the amplifiers are operating in a non-linear operating region, signal will take longer to recover than when the amplifiers are operating in the linear operating region. Therefore, signal sampled after the amplifiers have stepped into the non-linear operating region will be distorted.

Because the auxiliary amplifier in a regulated-cascode amplifier circuit increases pole-zero, settling speed of the amplifier will be affected. In conventional technique, a compensation capacitor is generally added to the output terminal of the auxiliary amplifier. FIG. 1 is a circuit diagram showing a conventional regulated-cascode amplifier circuit. As shown in FIG. 1, output terminals 144a and 144b of an auxiliary amplifier 140 are connected to compensation capacitors 146a and 146b respectively. Similarly, output terminals 154a and 154b of an auxiliary amplifier 150 are connected to compensation capacitors 156a and 156b respectively. When a large positive signal-swing input and turns off gate 116a, the feedback-loops (152a, 154b, 114a, 132b) and (142b, 144b, 112b, 130b) in branch 104 are broken respectively. The output of the auxiliary amplifiers 140 and 150 are driven the largest possible value. Under this condition, both the main-amplifier and the auxiliary amplifiers will run into the nonlinear region with slow settling behavior. The same behavior happened at the opposite branch 102 and large negative input signal. The recovery speed with this type of circuit architecture is limited by the slew rates of the auxiliary amplifiers 140 and 150. Since the tail current of an auxiliary amplifier is small, recovery speed of the amplifier is rather slow. Therefore, to have a higher recovery speed for the amplifier, the tail current of the auxiliary amplifiers 140 and 150 needs to be increased. However, increasing the tail current tends to increase power consumption of the circuit. In addition, maximum increase in the tail current is ultimately constrained by unit-gain frequency related stability of the auxiliary amplifier.

In brief, conventional treatment of regulated-cascode amplifier often leads to a slow-down of processing speed. Moreover, once the amplifier moves into the nonlinear operating region, recovery speed is retarded. At present, the only effective method of boosting speed is to increase the level of power consumption.

SUMMARY OF THE INVENTION

Accordingly, one object of the present invention is to provide a regulated-cascode amplifier having a clamping circuit therein. The clamped regulated-cascode amplifier circuit includes a positive sub-line, a negative sub-line, a first auxiliary amplifier, a second auxiliary amplifier and their corresponding clamping circuits. The positive sub-line and the negative sub-line are connected to a positive voltage supply line and a negative voltage supply line. The positive sub-line has a positive output terminal and the negative sub-line has a negative output terminal. Each positive sub-line and negative sub-line has a cascode transistor structure. Each cascode transistor structure includes at least a first cascode transistor and a second cascode transistor connected to their corresponding output terminals and the positive voltage supply line. In addition, each cascode transistor structure also includes at least a third cascode transistor and a fourth cascode transistor connected to their corresponding output terminal the negative voltage supply line. Furthermore, the source/drain terminals of the first cascode transistor are connected to the positive voltage supply line and a first voltage point. The source/drain terminals of the second cascode transistor are connected to the first voltage point and the corresponding output terminal. The source/drain terminals of the third cascode transistor are connected to the negative voltage supply line and a second voltage point. The source/drain terminals of the fourth cascode transistor are connected to the second voltage point and the corresponding output terminal.

The first auxiliary amplifier and the second auxiliary amplifier each has a positive terminal and a negative terminal, a positive-bias output terminal and a negative-bias output terminal. The input terminals of the first auxiliary amplifier are coupled to the first voltage point of the positive sub-line and the negative sub-line respectively. The input terminals of the second auxiliary amplifier are coupled to the second voltage point of the positive sub-line and the negative sub-line respectively. The clamping circuit includes a first diode and a second diode. The front terminal of the first diode is electrically connected to the end terminal of the second diode. The front terminal of the second diode is electrically connected to the end terminal of the first diode. The first auxiliary amplifier and the second auxiliary amplifier each contains the aforementioned clamping circuit. The positive-bias output terminal and the negative-bias output terminal of each auxiliary amplifier is connected to the terminals of their corresponding diodes in their respective clamping circuit.

In brief, the invention utilizes the connection between the output terminal of an auxiliary amplifier with a clamping circuit comprising of two front-to-end connected diodes so that the amplifier always operates in the linear region. With such an arrangement, operating speed of the regulated-cascode amplifier is increased without a corresponding increase in power consumption.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
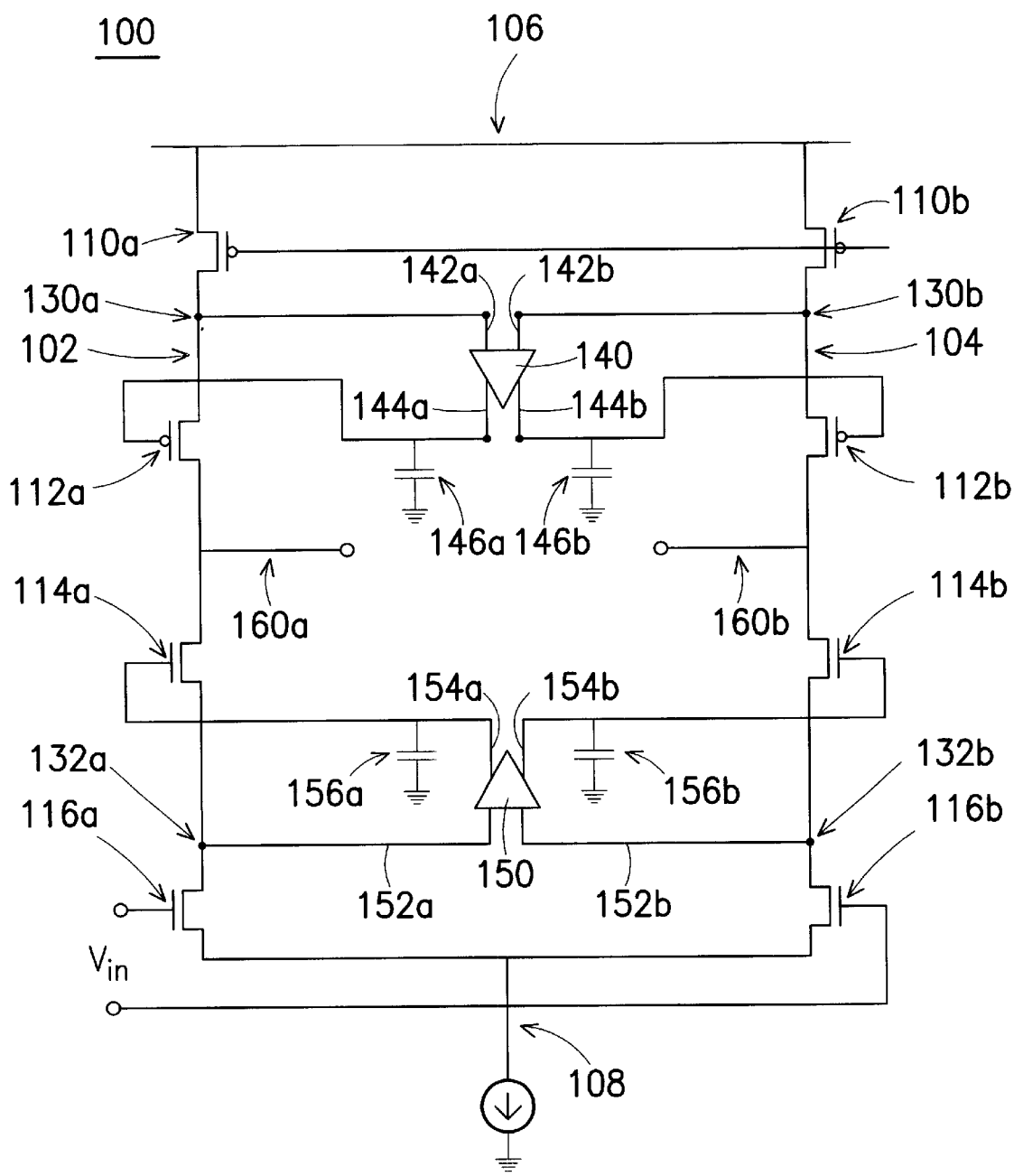
FIG. 1 is a circuit diagram showing a conventional regulated-cascode amplifier circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
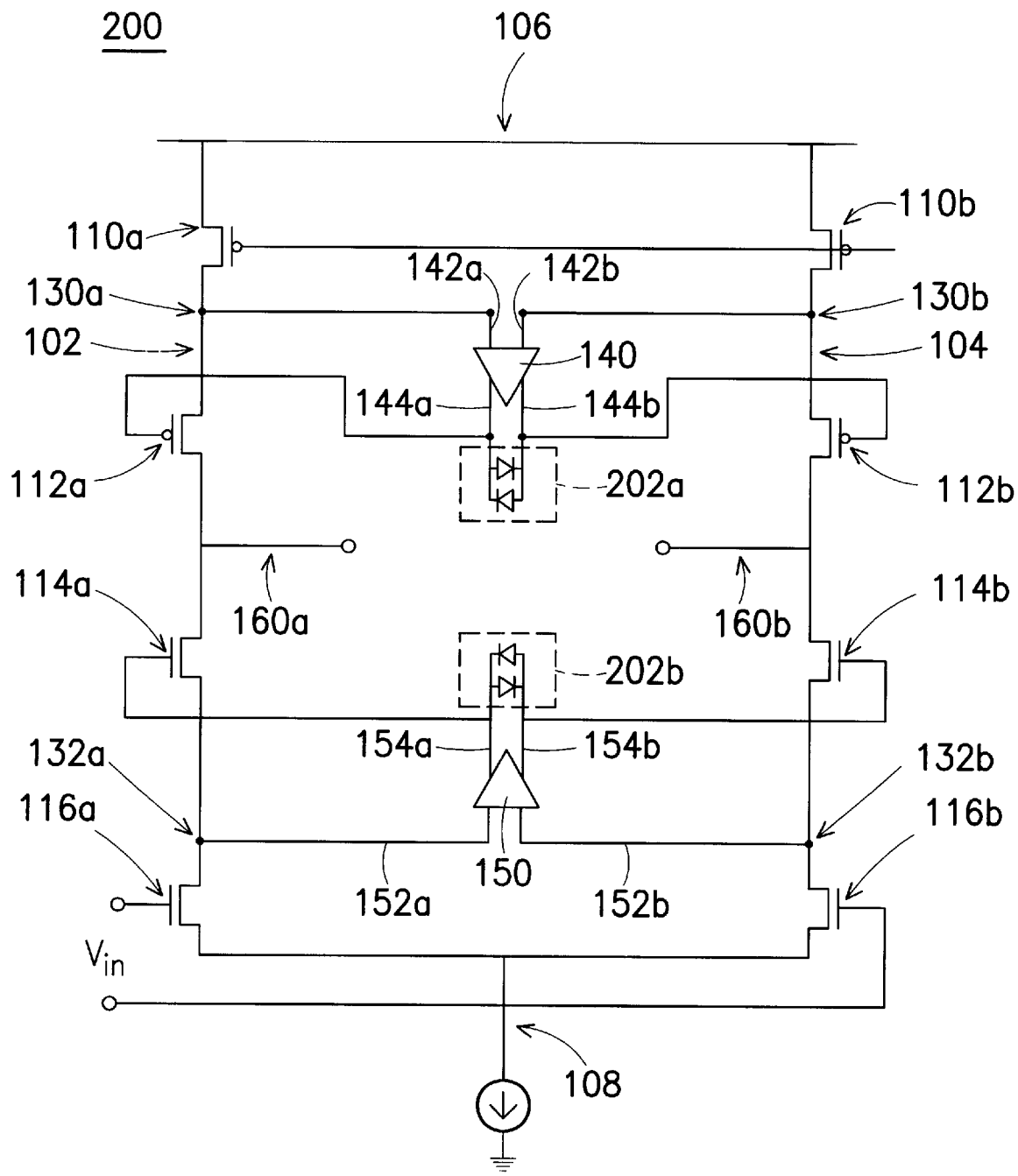
FIG. 2 is a circuit diagram showing a regulated-cascode amplifier circuit according to one preferred embodiment of this invention.

FIG. 2 is a circuit diagram showing a regulated-cascode amplifier circuit according to one preferred embodiment of this invention. As shown in FIG. 2, the regulated-cascode amplifier 200 includes a positive sub-line 102, a negative sub-line 104, a positive voltage supply line 106, a negative voltage supply line 108, a first auxiliary amplifier 140 and a second auxiliary amplifier 150. The cascode transistor structure on the positive sub-line 102 includes cascode transistors 110a, 112a, 114a and 116a. The cascode transistor structure on the negative sub-line 104 includes cascode transistors 110b, 112b, 114b and 116b. The positive sub-line 102 and the negative sub-line 104 are coupled to the positive voltage supply line 106 and the negative voltage supply line 108 respectively. The source/drain terminals of the cascode transistor 110a are coupled to the positive voltage supply line 106 and a voltage point 130a. The source/drain terminals of the cascode transistor 112a are coupled to the voltage point 130a and the positive output terminal 160a. The source/drain terminals of the cascode transistor 116a are coupled to the negative voltage supply line 106 and a voltage point 132a. The source/drain terminals of the cascode transistor 114a are coupled to the voltage point 132a and the positive output terminal 160a. Similarly, the source/drain terminals of the cascode transistor 110b are coupled to the positive voltage supply line 106 and a voltage point 130b. The source/drain terminals of the cascode transistor 112b are coupled to the voltage point 130b and the negative output terminal 160b. The source/drain terminals of the cascode transistor 116b are coupled to the negative voltage supply line 106 and a voltage point 132b. The source/drain terminals of the cascode transistor 114b are coupled to the voltage point 132b and the negative output terminal 160b.

The positive input terminal 142a and the negative input terminal 142b of the auxiliary amplifier 140 are coupled to the voltage point 130a and the voltage point 130b respectively. The positive bias voltage output terminal 144a and the negative bias voltage output terminal 144b of the auxiliary amplifier 140 are coupled to the respective gate of the cascode transistor 112a and the cascode amplifier 112b. Similarly, the positive input terminal 152a and the negative input terminal 152b of the auxiliary amplifier 150 are coupled to the voltage point 132a and the voltage point 132b respectively. The positive bias voltage output terminal 154a and the negative bias voltage output terminal 154b of the auxiliary amplifier 150 are coupled to the respective gate of the cascode transistor 114a and the cascode amplifier 114b. The clamping circuit 202a is coupled to the positive-bias output terminal 144a and the negative-bias output terminal 144b. The clamping circuit 202b is coupled to the positive-bias output terminal 154a and the negative-bias output terminal 154b.

Utilizing the voltage-resistance properties of the clamping circuit 202a, output from the auxiliary amplifier 140 is controlled within a desired working range. The desired working range generally refers to the linear operating region of an auxiliary amplifier. Similarly, utilizing the voltage-resistance properties of the clamping circuit 202b, output from the auxiliary amplifier 150 is also controlled within a desired working range.

Figure 3A:
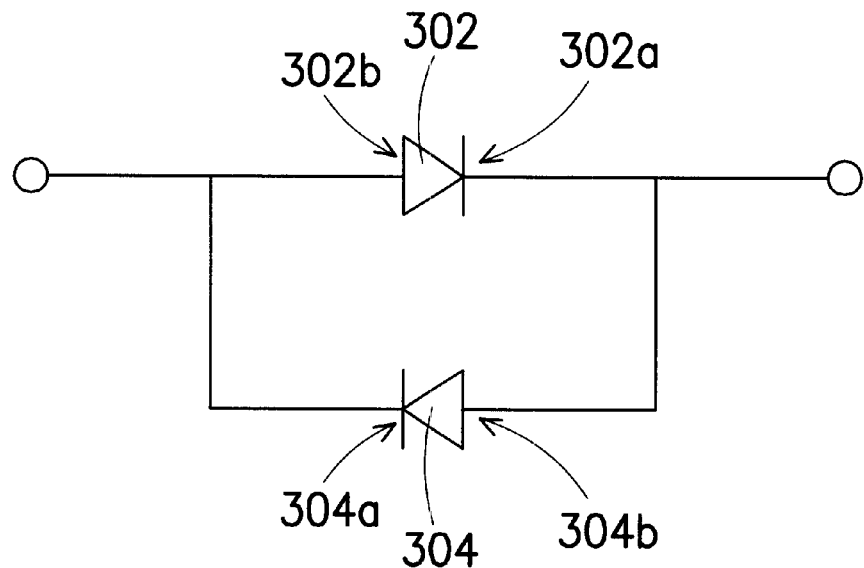
FIG. 3A is a diagram showing a clamping circuit according to a first preferred embodiment of this invention.
Figure 3B:
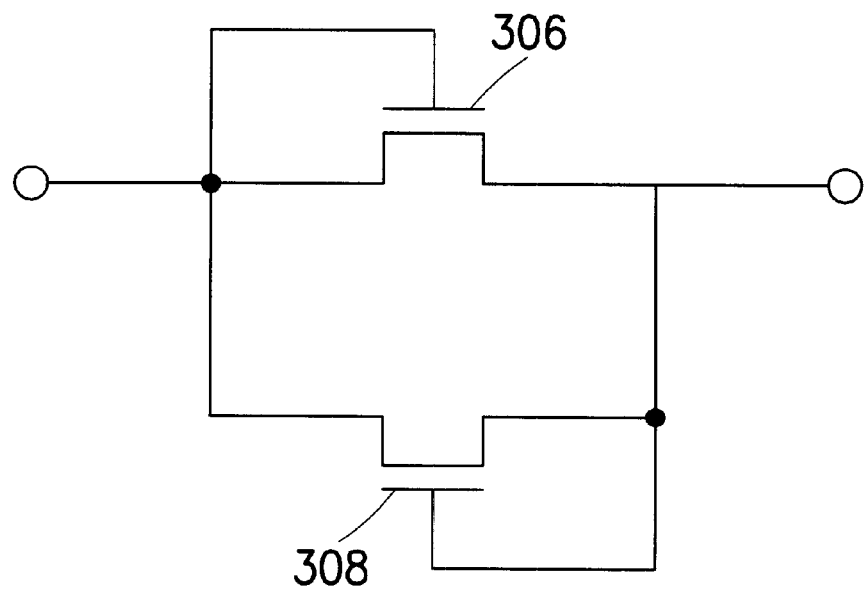
FIG. 3B is a diagram showing a clamping circuit according to a second preferred embodiment of this invention.

FIG. 3A is a diagram showing a clamping circuit according to a first preferred embodiment of this invention. As shown in FIG. 3A, the front terminal 302a of a diode 302 is electrically connected to the end terminal 304b of a second diode 304 while the front terminal of the diode 304 is electrically connected to the end terminal of the diode 302. Note that the clamping circuit of this invention is not just limited to a set of interconnected diodes. Any circuit that becomes conductive when the voltage between positive-bias output terminal and the negative-bias output terminal is greater than a pre-defined value but becomes non-conductive when the voltage is smaller than the pre-defined value can also serve as a clamping circuit in the auxiliary amplifier. For example, FIG. 3B is a diagram showing a clamping circuit according to a second preferred embodiment of this invention. As shown in FIG. 3B, the clamping circuit comprises of interconnected N-type MOS transistors 306 and 308. Similarly, two interconnected P-type NMOS transistor can be used as a clamping circuit as well.

In summary, this invention is capable of increasing the operating speed of a regulated-cascode amplifier without consuming more power.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A regulated-cascode amplifier circuit, comprising:
    a positive sub-line connected to a positive voltage supply line and a negative voltage supply line and having a positive output terminal;
    a negative sub-line connected to the positive voltage supply line and the negative voltage supply line and having a negative output terminal,
    wherein the positive sub-line and the negative sub-line each has a cascode transistor structure, each cascode transistor structure includes at least a first cascode transistor and a second cascode transistor coupled to their respective output terminal and the positive voltage supply line and at least a third cascode transistor and a fourth cascode transistor coupled to their respective output terminal and the negative voltage supply line,
    wherein the source/drain terminals of the first cascode transistor are coupled to the positive voltage supply line and a first voltage point respectively, the source/drain terminals of the second cascode transistor are coupled to the first voltage point and the corresponding output terminal, the source/drain terminals of the third cascode transistor are coupled to the negative voltage supply line and a second voltage point, and the source/drain terminals of the fourth cascode transistor are coupled to the second voltage point and the corresponding output terminal;

a first auxiliary amplifier and a second auxiliary amplifier each having a positive input terminal, a negative input terminal, a positive-bias output terminal and a negative-bias output terminal, wherein the input terminals of the first auxiliary amplifier are connected to the first voltage point of the positive sub-line and the negative sub-line, and the input terminals of the second auxiliary amplifier are connected to the second voltage point of the positive sub-line and the negative sub-line; and a clamping circuit having a first diode and a second diode, wherein the front terminal of the first diode is electrically connected to the end terminal of the second diode while the front terminal of the second diode is electrically connected to the end terminal of the first diode, wherein a clamping circuit is coupled to each of the first auxiliary amplifier and the second auxiliary amplifier such that the positive-bias output terminal and the negative-bias output terminal are coupled to the respective terminals of the clamping circuit.

2. The amplifier circuit of claim 1, wherein the first diode and the second diode can be metal-oxide-semiconductor (MOS) transistors.

3. A regulated-cascode amplifier circuit, comprising:

a positive sub-line connected to a positive voltage supply line and a negative voltage supply line and having a positive output terminal;

a negative sub-line connected to the positive voltage supply line and the negative voltage supply line and having a negative output terminal, wherein the positive sub-line and the negative sub-line each has a cascode transistor structure, each cascode transistor structure includes at least a first cascode transistor and a second cascode transistor coupled to their respective output terminal and the positive voltage supply line and at least a third cascode transistor and a fourth cascode transistor coupled to their respective output terminal and the negative voltage supply line, wherein the source/drain terminals of the first cascode transistor are coupled to the positive voltage supply line and a first voltage point respectively, the source/drain terminals of the second cascode transistor are coupled to the first voltage point and the corresponding output terminal, the source/drain terminals of the third cascode transistor are coupled to the negative voltage supply line and a second voltage point, and the source/drain terminals of the fourth cascode transistor are coupled to the second voltage point and the corresponding output terminal;

a first auxiliary amplifier and a second auxiliary amplifier each having a positive input terminal, a negative input terminal, a positive-bias output terminal and a negative-bias output terminal, wherein the input terminals of the first auxiliary amplifier are connected to the first voltage point of the positive sub-line and the negative sub-line, and the input terminals of the second auxiliary amplifier are connected to the second voltage point of the positive sub-line and the negative sub-line; and a plurality of clamping circuits coupled to the positive-bias output terminal and the negative-bias output terminal of the respective auxiliary amplifiers, wherein the clamping circuits become conductive when the voltage between positive-bias output terminal and the negative-bias output terminal is greater than a pre-defined value and the clamping circuits become non-conductive when the voltage between positive-bias output terminal and the negative-bias output terminal is smaller than the pre-defined value.

4. The amplifier circuit of claim 3, wherein the clamping circuit includes a circuit having a first diode and a second diode with the front terminal of the first diode electrically connected to the end terminal of the second diode while the front terminal of the second diode electrically connected to the end terminal of the first diode.

5. The amplifier circuit of claim 4, wherein the positive-bias output terminal and the negative-bias output terminal of the auxiliary amplifiers are connected to the respective terminals of the interconnected diode clamping circuit.

6. The amplifier circuit of claim 4, wherein the first diode and the second diode can be metal-oxide-semiconductor (MOS) transistors.

* * * * *